United States Patent [19]

Tsunoi et al.

[11] Patent Number: 4,779,011
[45] Date of Patent: Oct. 18, 1988

[54] LATCH CIRCUIT HAVING TWO HOLD LOOPS

[75] Inventors: Hiroyuki Tsunoi, Yokohama; Yasunori Kanai, Kuwana; Eiji Sugiyama; Motohiro Seto, both of Kawasaki; Naoyuki Ando, Yokohama, all of Japan

[73] Assignee: Fujitsu Limited, Kawasaki, Japan

[21] Appl. No.: 24,717

[22] Filed: Mar. 11, 1987

[30] Foreign Application Priority Data

Mar. 11, 1986 [JP] Japan ................................ 61-051369

[51] Int. Cl.$^4$ .................... H03K 3/284; H03K 19/086
[52] U.S. Cl. ..................................... 307/289; 307/455; 307/272.1
[58] Field of Search ............... 307/289, 291, 480, 455, 307/445, 272.1

[56] References Cited

U.S. PATENT DOCUMENTS

3,178,590  4/1965  Heilweil et al. ................ 307/289
3,339,089  8/1967  Bergman ........................ 307/289
4,045,693  8/1977  Ester ............................. 307/445
4,439,690  3/1984  Maley et al. ................. 307/272.1
4,675,553  6/1987  Price et al. ..................... 307/289

Primary Examiner—Stanley D. Miller
Assistant Examiner—Timothy P. Callahan
Attorney, Agent, or Firm—Staas & Halsey

[57] ABSTRACT

A latch circuit has two complementary hold loops therein for improving noise tolerance. The latch circuit includes a first gate for receiving a data and a first clock signal and outputting a first signal in response to a change in the clock signal. A second gate receives a second clock signal having an inverted polarity to that of the first clock signal. A third gate is operatively connected to output terminals of the first and second gates and outputs a first latch output. The latch circuit also includes a first hold line which supplies the first latch output to the second gate and a second hold line which supplies a second latch output of the latch circuit having an inverted polarity to that of the first latch output to the second gate. The second gate may have an inverted input terminal receiving the second latch output.

10 Claims, 5 Drawing Sheets

LATCH CIRCUIT HAVING TWO HOLD LOOPS

BACKGROUND OF THE INVENTION

1. Field of the Invention

The present invention relates to a latch circuit. More particularly, it relates to a latch circuit having two hold loops to improve the noise tolerance thereof.

2. Description of the Related Art

A variety of latch circuits, such as a delay (D) type flip-flop (FF) or a set-reset (R-S) type FF, are extensively known. These latch circuits have hold loops to feedback either a normal output Q or an inverted output $\overline{Q}$, and to hold the status latched therein. However, each latch circuit has only a single hold loop. Consequently, this type of the latch circuit malfunctions easily due to instantaneous electrical noises, such as the noise due to alpha-ray exposure. This will be described in more detail with reference to specific examples.

To overcome the above disadvantage, many countermeasures have been proposed, but disadvantages such as a low noise tolerance, a complex circuit configuration, etc., still remain.

SUMMARY OF THE INVENTION

An object of the present invention is to provide a latch circuit having a remarkably improved noise tolerance.

Another object of the present invention is to provide a latch circuit having a simple circuit configuration.

According to the present invention, there is provided a latch circuit including: a first gate for receiving a data and a first clock signal and outputting a first signal in response to a change in the clock signal; a second gate for receiving a second clock signal having an inverted polarity to that of the first clock signal; and a third gate operatively connected to output terminals of the first and second gates for receiving the first signal and a second signal from the second gate, and outputting a latch output. The latch circuit also includes a first hold line supplying the latch output to the second gate, and a second hold line supplying an inverted latch output of the latch circuit having an inverted polarity to that of the latch output to the second gate. The second gate may have an inverted input terminal receiving the inverted latch output.

The second gate may comprise a differential operation gate circuit having a switching element operating in response to a signal on the first hold line, and another switching element operating differentially to the first switching element and operating in response to a signal on the second hold line.

The differential operation gate circuit may comprise an emitter coupled logic gate circuit having a transistor operating in response to the signal on the first hold line and another transistor operating in response to the signal on the second hold line.

The latch circuit may be an "in-phase" hold type latch circuit, in which the first gate may comprise an OR gate circuit receiving the data and the first clock signal and outputting an OR output signal and a NOR output signal, the second gate may comprise an OR gate circuit receiving the second clock signal, a signal on the first hold line and a signal on the second hold line at the inverted input terminal and outputting an OR output signal and a NOR output signal, and the third gate may comprise an AND gate circuit receiving the OR output signals from the first and second gates and outputting an AND signal corresponding to the latch output signal of the latch circuit. The first hold line may be provided between an output terminal of the third gate, and a second input terminal of the second gate. The NOR outputs from the first and second gates are common-connected and provide the inverted latch output of the latch circuit. The second hold line may be provided between the common-connected point and the inverted input terminal of the second gate.

The latch circuit may be an "inverted-phase" hold type latch circuit, in which the first gate may comprise an NOR gate circuit receiving the data and the first clock signal and outputting a NOR output signal, the second gate may comprise a NOR gate circuit receiving the second clock signal, a signal on the first hold line and a signal on the second hold line at the inverted input terminal and outputting a NOR output signal, and the third gate may comprise an OR gate circuit receiving the NOR output signals from the first and second gates and outputs a NOR signal corresponding to the latch output signal of the latch circuit and an OR signal corresponding to the inverted latch output signal. The first hold line may be provided between an output terminal of the third gate outputting the NOR signal and an input terminal of the second gate. The second hold line may be provided between another output terminal of the third gate outputting the OR signal and the inverted input terminal of the second gate.

The latch circuit may further include an inverter operatively connected the second hold line, for receiving the inverted latch output on the second hold line, and supplying a twice inverted latch output to the second gate.

According to the present invention, there is also provided a latch circuit including: a first gate receiving a first signal at a first input terminal; a second gate operatively connected to receive output from the first gate, and receive a second signal having an inverted polarity to that of the first signal, and outputting a first latch output and a second latch output having an inverted polarity to that of the first latch output; a first hold line supplying the first latch output to a second input terminal of the first gate; and a second hold line supplying the second latch output to a third input terminal of the first gate.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Before describing the preferred embodiments of the present invention, some examples of prior art latch circuit will be described with reference to the drawings for comparison.

Figure 1:
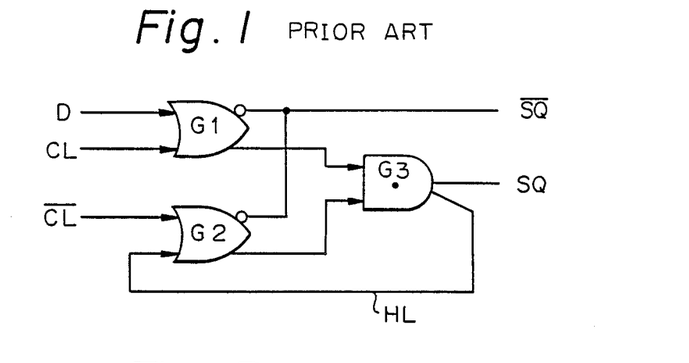
FIG. 1 is a circuit diagram of an "in-phase" hold type latch circuit of a prior art.
Figure 2A:
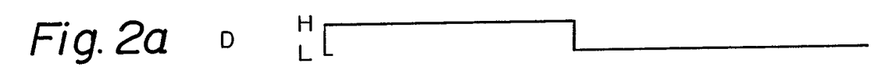
FIGS. 2a to 2e are timing charts illustrating the operation of the "in-phase" hold type latch circuit shown in FIG. 1.
Figure 2B:
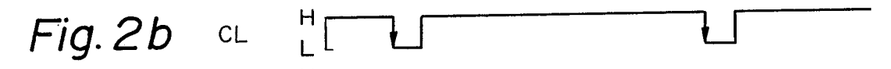
Figure 2C:
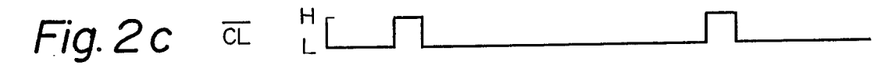
Figure 2D:
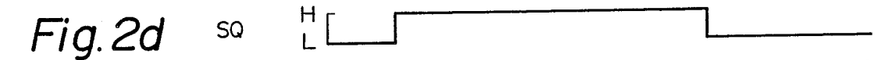
Figure 2E:
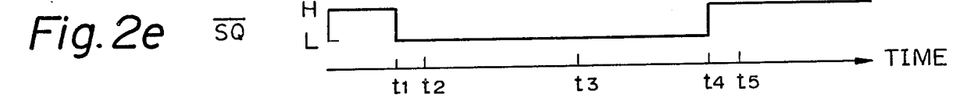

Referring to FIG. 1, an "in-phase" hold type latch circuit of the prior art consists of a first OR gate G1 receiving a data D and a clock signal CL and outputting an inverted output SQ and a non-inverted internal output, a second OR gate G2 receiving an inverted clock signal $\overline{CL}$ at an input terminal thereof and outputting an inverted output connected to the inverted output $\overline{SQ}$ from the OR gate G1 and a non-inverted internal output, and a wired-AND gate G3 receiving the non-inverted internal outputs from the OR gates G1 and G2 and outputting a non-inverted (normal) output SQ. A hold line HL is provided between an output terminal of the wired-AND gate G3 and another input terminal of the OR gate G2.

The operation of the latch circuit in FIG. 1 will be described with reference to FIGS. 2a to 2e. The basic operation of the latch circuit is that the data D is latched in response to the trailing of the clock signal CL. At a time t1, when the clock signal CL is changed from a high level "H" to a low level "L" a high level "H" of the data D is taken in the latch circuit. As a result, the OR gate G1 outputs a low level signal at the inverted output terminal and a high level signal at the non-inverted output terminal. At the same time, the inverted output of the OR gate G2 becomes low level, because the inverted clock signal $\overline{CL}$ applied to the 0R gate G2 is at a high level. Accordingly, the inverted output $\overline{SQ}$ of the latch circuit becomes low level. Conversely, as two output signals from the OR gate G1 and G2 applied to the AND gate G3 are high level, the AND gate G3 outputs a high level non-inverted output SQ. At a time t2, the clock signal CL is restored to a high level "H" from a low level "L", but, as the data D is still at a high level, the OR gate G1 still outputs a high level signal at the non-inverted output terminal, and the AND gate G3 still outputs the high level non-inverted output SQ. As a result, the output signals from the OR gates G1 and G2, and accordingly, the outputs SQ and $\overline{SQ}$, are maintained, regardless of whether or not the clock signal CL is restored. At a time t3, the data D is changed from a high level "H" to a low level "L", but the feedback signal on the hold loop HL is maintained at a high level "H". As a result, the output SQ and $\overline{SQ}$ are not changed.

At a time t4, when the clock signal CL is again changed from a high level "H" to a low level "L", a low level "L" of the data D is taken in the latch circuit. The OR gate G1 outputs a high level signal at the inverted output terminal and a low level signal at the non-inverted output terminal, and the AND gate G3 outputs a low level signal. That is, the non-inverted output SQ of the latch circuit is changed to a low level. On the other hand, the output signals from the inverted output terminals of the OR gate G1 and G2 are high level, and thus the inverted output $\overline{SQ}$ of the latch circuit is changed to a high level. At a time t5, when the clock signal CL is restored to a high level "H", and the inverted clock signal CL is synchronously changed to a low level, the OR gate G2 outputs a high level signal at the inverted output terminal and a low level signal at the non-inverted output terminal. The output of the AND gate G3 becomes low level, and as a result, a low level of the non-inverted output SQ and a high level of the inverted output $\overline{SQ}$ are maintained.

As described above, the hold loop HL has the above data latch function.

When a semiconductor circuit substrate including the above latch circuit is exposed to alpha ($\alpha$) rays, pairs of holes and electrons are generated in the substrate along exposure lines traversing the semiconductor layers formed in the substrate. The holes in the semiconductor are extracted to a P-type semiconductor layer of a N-P-N transistor applied with a negative voltage, and the electrons are extracted to a depletion layer at a P-N junction. As a result, a potential at a collector of the N-P-N transistor may fall in a short period.

If a transistor connected to the hold line HL is exposed to alpharays when the non-inverted output SQ, i.e., the feedback signal on the hold line HL, is high, a voltage at a collector of the transistor, i.e., a voltage of the feedback signal on the hold line HL, may fall in a short period due to the above phenomenon. If the level of the voltage on the hold line HL becomes lower than a threshold level $V_{TH}$ of a transistor in, for example, the OR gate G2, the OR gate G2 may output a low level signal from the non-inverted output terminal thereof in a short time. As a result, the output SQ may be changed to a low level, and the feedback signal on the hold line HL also may be changed to a low level. The inverted output $\overline{SQ}$ of the latch circuit is changed to a high level. This means that the latch circuit in FIG. 1 will malfunction due to the noise of the alpharays.

Figure 3:
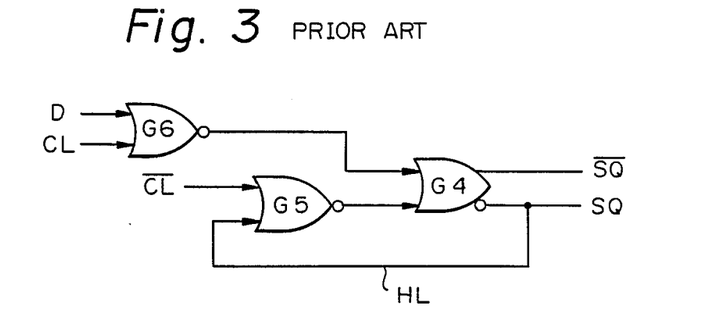
FIG. 3 is a circuit diagram of an "inverted-phase" hold type latch circuit of another prior art.

Referring to FIG. 3, an "inverted phase" hold type latch circuit of the prior art consists of two NOR gates G5 and G6, and an OR gate G4. The NOR gate G6 receives the data D and the clock signal CL, and the NOR gate G5 receives the inverted clock signal $\overline{CL}$. A hold line HL is provided between an inverted output terminal of the OR gate G4 and an input terminal of the NOR gate G5. The OR gate G4 outputs an inverted output $\overline{SQ}$ and a non-inverted output SQ.

The operation of the latch circuit in FIG. 3 is the same as that of the latch circuit in FIG. 1, as described with reference to FIGS. 2a to 2e, and thus a description thereof is omitted.

The latch circuit of FIG. 3 also suffers from the disadvantage of a malfunction due to the noises.

Now, preferred embodiments of the present invention will be described.

An "in-phase" hold type latch circuit according to the present invention will be described with reference to FIG. 4. The in-phase type latch circuit includes a first OR gate G11, a second OR gate G12, and a wired-AND gate G13. The first OR gate G11 receives a data D and a clock signal CL and outputs an inverted internal output signal $S11_i$ at an inverted output terminal and a non-inverted internal output signal $S11_n$. The second OR gate G12 receives an inverted clock signal $\overline{CL}$ and outputs an inverted internal output signal $S12_i$ at an inverted output terminal and a non-inverted internal output signal $S12_n$. The wired-AND gate G13 receives the non-inverted internal output signals $S11_n$ and $S12_n$ from the OR gates G11 and G12 and outputs an AND output signal. A first hold line HL1 is provided between an output terminal of the AND gate G13 and a second input terminal of the second OR gate G12. The inverted output terminals of the OR gates G11 and G12 are commonly connected to provide an inverted output $\overline{SQ}$ of the latch circuit. The AND gate G13 provides a non-inverted output SQ.

The above circuit structure is similar to that of FIG. 1. Note, however, that an additional hold line HL2 having an inversion function is provided between the inverted output terminal of the OR gate G12 and a third input terminal of the OR gate G12. Therefore, the latch circuit of FIG. 4, has two hold lines HL1 and HL2 on which the feedback signals have inverted polarities.

The operation of the latch circuit of FIG. 4 will be described with reference to FIGS. 5a to 5e. The basic normal operation of the latch circuit is similar to that of the latch circuit in FIG. 1, and the data D is latched in response to the trailing of the clock signal CL.

At a time t1, the clock signal CL is changed from a high level "H" to a low level "L", and then, a high level "H" of the data D is taken in the latch circuit. As a result, the first OR gate G11 outputs the signal $S11_i$ having a low level "L" at the inverted output terminal and the internal output signal $S11_n$ having a high level "H" at the non-inverted output terminal. At the same time, the inverted internal output signal $S12_i$ of the second OR gate G12 is at a low level, because the inverted clock signal CL applied to the first input terminal of the OR gate G12 is at a high level. Accordingly, the inverted output $\overline{SQ}$ of the latch circuit becomes low level. Conversely, as two internal output signals $S11_n$ and $S12_n$ applied to the AND gate G13 are high level, the AND gate G3 outputs the non-inverted output SQ having a high level. At a time t2, the clock signal CL is restored to a high level "H" from a low level "L", but as the data D is still at a high level, the OR gate G11 still outputs the internal output signal $S11_i$ having a high level at the non-inverted output terminal, and the AND gate G13 still outputs the non-inverted output SQ having a high level. As a result, the internal output signals $S11_i$, $S11_n$, $S12_i$ and $S12_n$ from the OR gate G11 and G12, and accordingly, the outputs SQ and $\overline{SQ}$, are maintained, regardless of whether or not the change of the clock signal CL is restored. At a time t3, the data D is changed from a high level "H" to a low level "L", but the clock signal CL is restored a high level "H", and, the feedback signal on the hold loop HL1 is kept at a high level "H", and the feedback signal on the hold loop HL2 is also kept at a low level "L". As a result, the outputs SQ and $\overline{SQ}$ are not changed.

At a time t4, when the clock signal CL is again changed from a high level "H" to a low level "L", a low level "L" of the data D is taken in the latch circuit. The OR gate G11 outputs the internal output signal $S11_i$ having a high level at the inverted output terminal and the internal signal $S11_n$ having a low level at the non-inverted output terminal. The AND gate G13 outputs a low level signal. That is, the non-inverted output SQ of the latch circuit is changed to a low level. On the other hand, the internal output signals $S11_i$ and $S12_i$ from the inverted output terminals of the OR gates G11 and G12 are at a high level, and thus the inverted output $\overline{SQ}$ of the latch circuit is changed to a high level. At a time t5, when the clock signal CL is restored to a high level "H", and the inverted clock signal $\overline{CL}$ is synchronously changed to a low level, the OR gate G12 outputs the internal output signal at $S12_i$ having a high level the inverted output terminal and the internal output signal $S12_n$ having a low level at the non-inverted output terminal. The output of the AND gate G13 becomes low level. As a result, a low level of the non-inverted output SQ and a high level of the inverted output $\overline{SQ}$ are maintained.

The above operation is identical in principle to that of the latch circuit of FIG. 1.

At a time T1, if a transistor connected to the hold line HL1 is exposed to alpha-rays when the non-inverted output SQ is at a high level, a voltage at a collector of the above transistor may be fall in a short period. If the additional hold line HL2 is not provided, the non-inverted output SQ may be changed to a low level, as shown by a dotted line in FIG. 5d, due to the voltage of the feedback signal on the hold line HL1 becoming lower than a threshold level $V_{TH}$ of the OR gate G12, as set forth above. In the embodiment, the voltage of the feedback signal on the hold line HL1 may fall lower than the threshold level. However, a low level voltage of the feedback signal on the additional hold line HL2 is not affected by noise. The feedback signal on the hold line HL2 is inverted at the input terminal of the OR gate G12 and ensures an output of the internal output signal $S12_n$ having a high level from the OR gate G12. As a result, the AND gate G13 still outputs the non-inverted output SQ having a high level regardless of the application of noise to the hold line HL1.

Figure 5A:
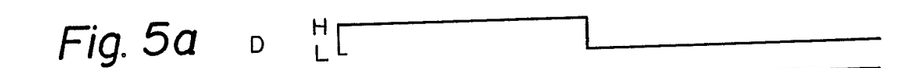
FIGS. 5a to 5e are timing charts illustrating the operation of the "in-phase" hold type latch circuit shown in FIG. 4.
Figure 5B:
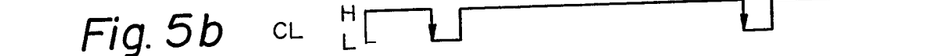
Figure 5C:
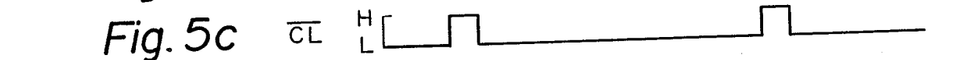
Figure 5D:
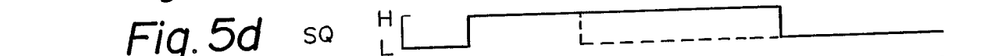
Figure 5E:
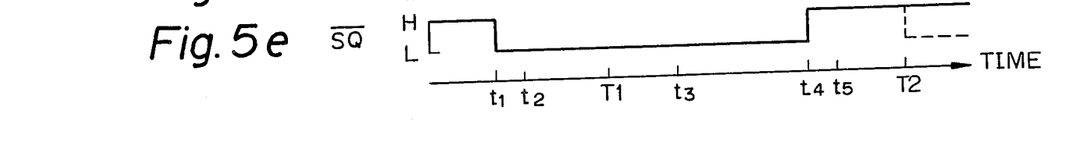

Conversely, at a time T2, if transistors in the OR gate G11 and/or another transistor in the OR gate G12 are exposed to alpha-rays when the inverted output $\overline{SQ}$ is at a high level, the inverted output $\overline{SQ}$ also may fall in a short period as shown in FIG. 5e. However, the feedback signal having a low level on the hold line HL1 ensures an output of the internal output signal $S12_i$ having a high level at the inverted output terminal of the OR gate G12, and the internal output signal $S12_n$ having a low level at the non-inverted output terminal of the OR gate G12. As a result, the outputs SQ and $\overline{SQ}$ are not changed even if noise is applied to the hold line HL2.

As described above, the provision of the hold line HL1 directly connected between the output terminal of the AND gate G13 and the second input terminal of the OR gate G12, i.e., the direct feedback of the non-inverted output SQ to the OR gate G12, and the provision of the hold line HL2 directly connected between the common-connected point of the inverted output terminals of the OR gates G11 and G12 and the third input terminal having an inversion function of the OR gate G12, i.e., the direct feedback of the inverted output $\overline{SQ}$ to the OR gate G12, provides an improved noise tolerance.

Figure 4:
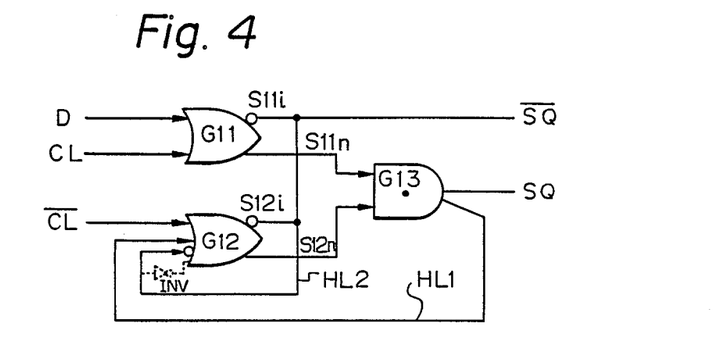
FIG. 4 is a circuit diagram of an embodiment of an "in-phase" hold type latch circuit according to the present invention.

In addition, the latch circuit of FIG. 4 has a very simple construction.

Figure 6:
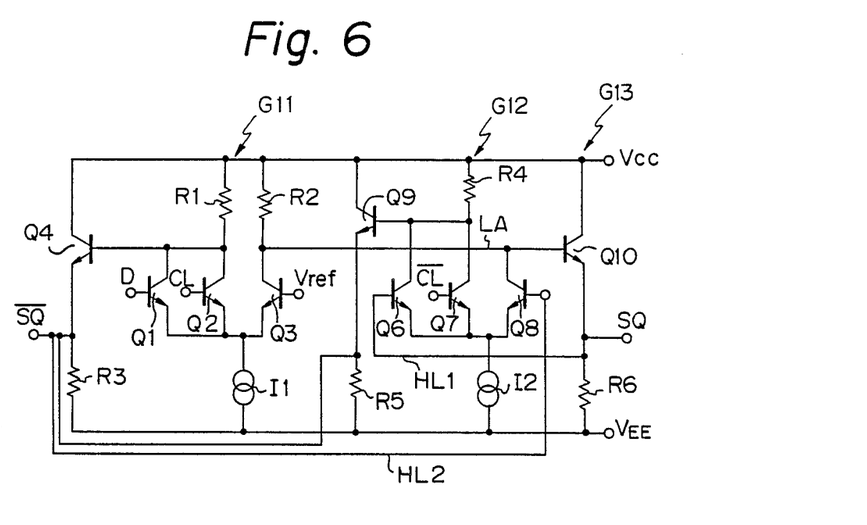
FIG. 6 is a specific circuit diagram of the "in-phase" hold type latch circuit shown in FIG. 4.

Referring to FIG. 6, a more specific circuit of the "in-phase" hold type latch circuit of FIG. 4 will be described.

The "in-phase" hold type latch circuit includes a first OR gate G11 formed by an emitter-coupled logic (ECL) gate circuit consisting of transistors Q1 to Q3, a current source I1 and resistors R1 and R2, an output transistor Q4, and a resistor R3, and a second OR gate G12 formed by an ECL gate circuit consisting of transistors Q6 to Q8, a current source I2 and a resistor R4, an output transistor Q9, and a resistor R5. The latch circuit also includes a wired-AND gate G13 having a transistor Q10, a resistor R6, and a wired-AND circuit. The wired-AND circuit has a line $L_A$ connected between a collector of the transistor Q3 in the OR gate G11 and a collector of the transistor Q8 in the OR gate G12, and also connected to a base of the transistor Q10. Then, the wired-AND circuit is collector-dotted.

The first hold line HL1 is provided between an emitter of the transistor Q10 in the AND gate G13 and a base of the transistor Q6 in the OR gate G12. The second hold line HL2 is also provided between an emitter of the transistor Q4 in the OR gate G11 and a base of the transistor Q8 in the OR gate G12. The emitter of the transistor Q4 and an emitter of the transistor Q9 are also commonly connected.

In this embodiment, the feedback signals on the hold lines HL1 and HL2 are directly connected to the bases of the transistors Q6 and Q8 and have a complementary relationship. In other words, the feedback signal on the hold line HL1 has an inverted phase of feedback signal on the hold line HL2. The differential operation circuit of the ECL gate in the OR gate G12 makes it possible to directly receive the complementary feedback signals on the hold lines HL1 and HL2.

The latch circuit of FIG. 6 is supplied with a first power source $V_{CC}$ and a second power source $V_{EE}$.

The data D is supplied to a base of the transistor Q1, and the clock signal CL is supplied to a base of the transistor Q2. The inverted clock signal $\overline{CL}$ is supplied to a base of the transistor Q7, and a reference voltage Vref, for example, −1.3V, is supplied to a base of the transistor Q3. The non-inverted output SQ is extracted from a common-connected point of the emitter of the transistor Q10 and the resistor R6, and the inverted output $\overline{SQ}$ is extracted from a common-connected point of the emitter of the transistor Q4 and the resistor R3.

The normal operation of the latch circuit of FIG. 6 is similar to that of the latch circuit of FIG. 4, and thus a description thereof is omitted.

When the transistor Q3 is turned OFF, i.e., the transistor Q10 is turned ON, the signal SQ having a high level is output, if electrical noise is applied to the transistor Q3, the voltage at the collector of the transistor Q3 may be fall in a short period. However, the low level voltage of the feedback signal on the hold line HL2 is still supplied to the base of the transistor Q8, and thus the transistor Q10 is not turned OFF. As a result, the output SQ is not changed by the noise.

Note that the direct connection between the emitter of the transistor Q4 and the base of the transistor Q8, forming the hold line HL2, further improves the noise margin. Because the base of the transistor Q8 may be supplied with the signal having, for example, approximately −1.7V, sum of the reference voltage Vref of −1.3V and an additional voltage of −0.4V, when the base of the transistor Q6 is supplied with the output signal SQ of −0.9V, and accordingly, when the latch circuit holds the output signal SQ having a high level. This means that an amplitude of the voltage supplied to the base of the transistor Q8 is approximately doubled. As a result, the noise margin will be doubled. This will be described in more detail with reference to an introduction of another circuit construction.

The above function of improving the noise tolerance can be realized by, for example, providing an inverter INV, as shown in dotted line in FIG. 4, on the hold line HL2 at a forward step of the third input terminal of the OR gate G12 in FIG. 4, and by changing the OR gate G12 having the third inverted input terminal to an OR gate having three non-inverted input terminals. The above modified circuit can be specifically realized to modify the circuit in FIG. 6; by providing an additional transistor parallel to the transistor Q6, removing the hold line HL2 between the base of the transistor Q8 and the emitter of the transistor Q4, supplying the reference voltage Vref to the base of the transistor Q8 as to the transistor Q3, and providing an inverter between the emitter of the transistor Q4 and a base of the additional transistor.

When comparing the virtual modified latch circuit and the latch circuit of FIG. 6, the base of the transistor Q8 in the modified latch circuit is supplied with only the reference voltage Vref of −1.3V. On the other hand, the base of the transistor Q8 in the latch circuit of FIG. 6 is supplied with the voltage of −1.7V. The circuit of FIG. 6, however, provides a higher noise tolerance.

In addition, the construction of the latch circuit of FIG. 6 is simpler than that of the virtual modified latch circuit.

Another embodiment of a latch circuit according to the present invention will be described with reference to FIG. 7.

Figure 7:
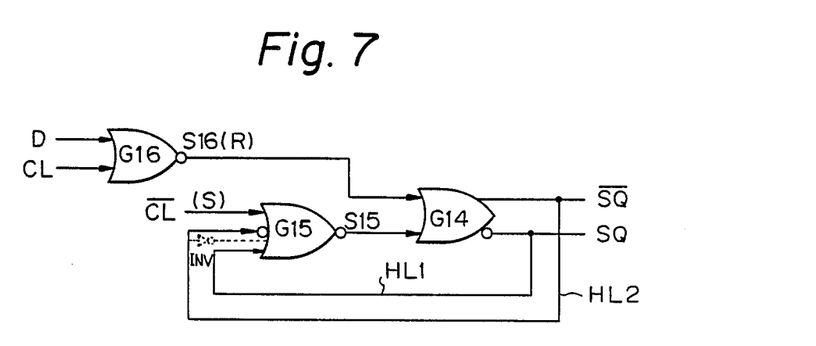
FIG. 7 is a circuit diagram of another embodiment of an "inverted-phase" hold type latch circuit according to the present invention.

The latch circuit in FIG. 7 is a so-called "inverted phase" hold type latch circuit and corresponds to the latch circuit of FIG. 3. The latch circuit of FIG. 7 includes a first NOR gate G16 receiving a data D and a clock signal CL, a second NOR gate G15 receiving an inverted clock signal $\overline{CL}$, and an OR gate G14. The latch circuit is provided with two hold lines HL1 and HL2. The hold line HL1 is provided between an inverted output terminal of the OR gate G14 and a third input terminal of the NOR gate G15, and the hold line HL2 is provided between a non-inverted output terminal of the OR gate G14 and an inverted input terminal of the NOR gate G15. A signal on the hold line HL1 has an inverted phase relationship to a signal on the hold line HL2.

The operation of the latch circuit of FIG. 7 will be described with reference to Table 1 below and FIGS. 5a and 5e.

TABLE 1

| TIME   | t1∼t2                           | t4∼t5                           |
|--------|---------------------------------|---------------------------------|
| D      | H                               | L                               |
| CL     | H → L* → H                      | H → L* → H                      |
| R      | L                               | H*                              |
| CL (S) | L → H* → L                      | L → H* → L                      |
| SQ     | H                               | L                               |
| $\overline{SQ}$ | L                      | H                               |

In Table 1, asterisks (*) indicate short period signals.

At the time t1, the data D is at a high level "H" and the clock signal CL is changed to a low level "L", and accordingly, the NOR gate G16 outputs a signal S16 having a low level "L". The NOR gate G15 receives the inverted clock signal $\overline{CL}$ having a high level "H" and outputs an signal S15 having a low level "L". As a result, the OR gate G14 outputs a non-inverted output SQ having a high level "H" at an inverted output terminal and an inverted output $\overline{SQ}$ having a low level "L" at another output terminal.

A signal having a high level on the hold line HL1 and/or a signal having a low level on the hold line HL2 ensure that a low level of the signal S15 from the NOR gate G15 is maintained when the clock signal CL is restored to a high level and the inverted clock signal $\overline{CL}$ is also restored to a low level at the time t2.

At the time t4, the data D is a low level "L" and the clock signal CL is again changed to a low level "L", then the NOR gate G16 outputs the signal S16 having a high level "H". As a result, the OR gate G14 receiving the signal S16 having a high level outputs the inverted output $\overline{SQ}$ having a high level and the non-inverted output SQ having a low level. At the time t5, the clock signal CL is restored to a high level, and accordingly, the signal S16 from the NOR gate G16 is changed to a low level "L". On the other hand, the inverted clock signal $\overline{CL}$ having a low level, the inverted output $\overline{SQ}$ having a high level to the inverted input terminal of the NOR gate G15 and the non-inverted output SQ having a low level are supplied to the NOR gate G15, and the signal S15 having a high level is output, and the output status of the outputs SQ and $\overline{SQ}$ is maintained.

As can be been form the above description, the OR gate G14, the NOR gate G15, and the hold lines HL1 and HL2 form a set-reset (R-S) type flip-flop. The NOR gate G16 provides a reset signal R, and the inverted clock signal $\overline{CL}$ supplied to the NOR gate G15 corresponds to a set signal S.

The improvement of the noise tolerance due to the provision of the hold line HL2 in addition to the latch circuit of FIG. 3 is obtained in manner similar to that of the latch circuit of FIG. 4, as set forth above.

In the embodiment, the provision of the inverted input terminal at the NOR gate G15 for directly receiving an additional feedback signal on the hold line HL2 results in a greater noise margin than that of the latch circuit using an inverter INV as shown by dotted line, as described above with reference to FIGS. 4 and 6.

A more concrete circuit of the "inverted-phase" hold type latch circuit of FIG. 7 will be described with reference to FIG. 8.

The "inverted-phase" hold type latch circuit includes the NOR gate G16 formed by an ECL gate circuit consisting of transistors Q32, Q33, and Q34, a current source I16 and resistors R21 and R22, an output transistor Q31 and a resistor R23, the OR gate G14 formed by an ECL gate circuit consisting of transistors Q11, Q12, and Q13, a current resistor I14 and resistors R11 and R12, output transistors Q14 and Q15, and resistors R13 and R14, and the NOR gate G15 formed by an ECL gate circuit consisting of transistors Q16, Q17, and Q18, a current source I15 and resistors R15 and R16, 97 output transistor Q19, and a resistor R17. The latch circuit is supplied with the first and second power source $V_{CC}$ and $V_{EE}$.

The data D is supplied to a base of the transistor Q32, and the clock signal CL is supplied to a base of the transistor Q33. The inverted clock signal $\overline{CL}$ is supplied to a base of the transistor Q17. A base of the transistor Q11 is supplied with a signal from an emitter of the transistor Q19, and a base of the transistor Q12 is supplied with a signal from an emitter of the transistor Q31. The base of the transistors Q34 and Q13 are supplied with the reference voltage Vref.

The first hold line HL1 is provided between an emitter of the transistor Q14 and a base of the transistor Q16, and the second hold line HL2 is provided between an emitter of the transistor Q15 and a base of the transistor Q18. The signals on the hold lines HL1 and HL2 have inverted polarities. In the latch circuit, feedback signals, i.e., the signals from the transistors Q14 and Q15, are directly supplied to the bases of the transistors Q16 and Q18 without providing an inverter. This also results in a high noise tolerance and a simple circuit configuration.

In FIG. 7, if the gate G16 is removed, a reset signal R is supplied to the gate G14 instead of the signal S16 and a set signal S is supplied to the gate G15 instead of the inverted clock signal $\overline{CL}$, the latch circuit may operate as a set-reset type flip-flop. The operation is shown in Table 1.

Figure 8:
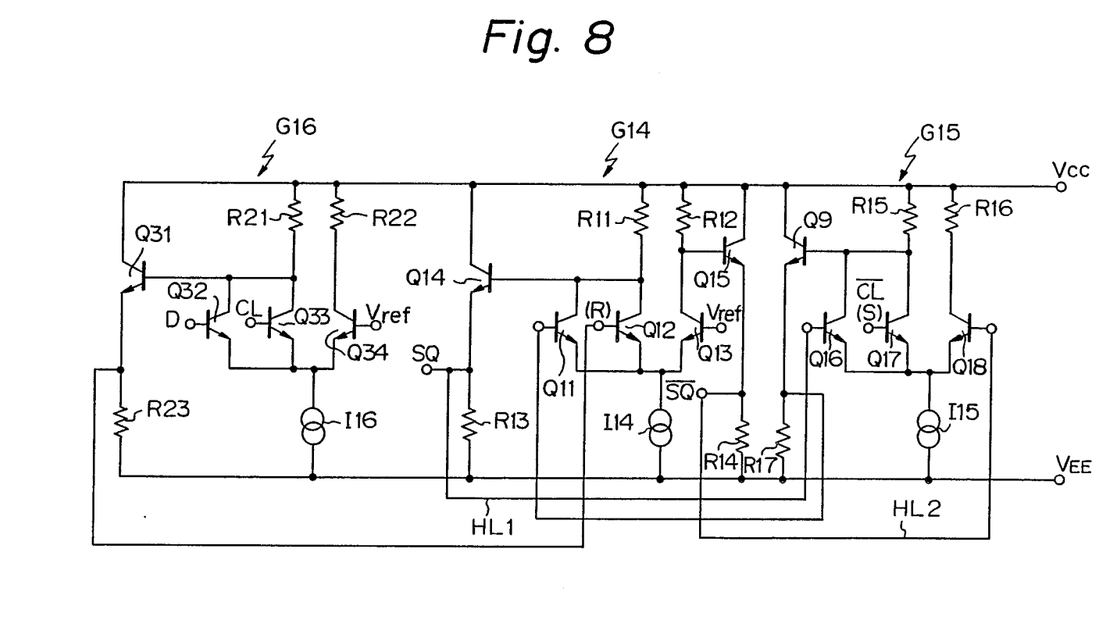
FIG. 8 is a specific circuit diagram of the "inverted-phase" hold type latch circuit shown in FIG. 7.

In FIGS. 6 and 8, the differential operation circuits of the ECL gate circuit can be replaced by other differential operation circuits, such as a MOS gate circuit, etc.

Many widely different embodiments of the present invention may be constructed without departing from the spirit and scope of the present invention. It should be understood that the present invention is not limited to the specific embodiments described in this specification, except as defined in the appended claims.

We claim:
1. A latch circuit comprising:
a first gate for receiving a data and a first clock signal and outputting a first signal in response to a change in said first clock signal;
a second gate for receiving a second clock signal having an inverted polarity to that of said first clock signal;
a third gate connected to output terminals of said first and second gates for receiving said first signal from said first gate and a second signal from said second gate, and outputting a latch output,
said second gate outputting said second signal and an inverted latch output in response to a change of said inverted clock signal;
a first hold line for supplying said latch output to said second gate; and
a second hold line for supplying to said second gate the inverted latch output having an inverted polarity to that of said latch output.

2. A latch circuit according to claim 1, wherein said second gate has an inverted input terminal for receiving said inverted latch output on said second hold line.

3. A latch circuit according to claim 2, wherein said first gate comprises an OR gate circuit receiving said data and said first clock signal and outputs an OR output signal and a NOR output signal,
said second gate comprises an OR gate circuit receiving said second clock signal, a signal on said first hold line and a signal on said second hold line at said inverted input terminal and outputs an OR output signal and a NOR output signal, and
said third gate comprises an AND gate circuit receiving said OR output signals from said first and second gates and outputs an AND signal corresponding to said latch output signal of said latch circuit,
said first hold line being provided between an output terminal of said third gate and a second input terminal of said second gate,
said NOR outputs from said first and second gates being common-connected and providing said inverted latch output, and
said second hold line being provided between said common-connected point and said inverted input terminal of said second gate.

4. A latch circuit according to claim 2, wherein said first gate comprises an NOR gate circuit receiving said data and said first clock signal and outputs a NOR output signal,
said second gate comprises a NOR gate circuit receiving said second clock signal, a signal on said first hold line and a signal on said second hold line at said inverted input terminal and outputs a NOR output signal, and said third gate comprises an OR gate circuit receiving said NOR output signals from said first and second gates and outputs a NOR signal corresponding to said latch output and an OR signal corresponding to said inverted latch output, said first hold line being provided between an output terminal of said third gate outputting said NOR signal and an input terminal of said second gate, and said second hold line being provided between another output terminal of said third gate outputting said OR signal and said inverted input terminal of said second gate.

5. A latch circuit according to claim 2, wherein said second gate comprises a differential operation gate circuit having a switching element operating in response to a signal on said first hold line and another switching element operating differentially to said switching element and operating in response to a signal on said second hold line.

6. A latch circuit according to claim 5, wherein said differential operation gate circuit comprises an emitter coupled logic gate circuit having a transistor operating in response to said signal on said first hold line and another transistor operating in response to said signal on said second hold line.

7. A latch circuit according to claim 1, further comprising an inverter operatively connected to said second hold line for receiving said inverted latch output on said second hold line, and supplying a twice inverted latch output to said second gate.

8. A latch circuit comprising:
a first gate for receiving a first signal at a first input terminal;
a second gate connected to receive an output from said first gate and for receiving a second signal having an inverted polarity to that of said first signal, and outputting a first latch output and a second latch output having an inverted polarity to that of said first latch output;
a first hold line for supplying said first latch output to a second input terminal of said first gate; and
a second hold line for supplying said second latch output to a third terminal of said first gate.

9. A latch circuit according to claim 8, wherein said third input terminal of said fist gate coprises an inverted input terminal receiving said second latch output on said second hold line.

10. A latch circuit according to claim 8, further comprising an inverter operatively connected to said second hold line, receiving said second latch output on said second hold line, and supplying an inverted second latch output to said third input terminal of said second gate.

* * * * *